United States Patent
Chu et al.

(10) Patent No.: US 7,411,833 B2
(45) Date of Patent: Aug. 12, 2008

(54) NITRIDE TRAPPING MEMORY DEVICE AND METHOD FOR READING THE SAME

(75) Inventors: Chi-Ling Chu, Taichung (TW); Hsien-Wen Hsu, Taipei (TW); Jian-Yuan Shen, Taichung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/987,240

(22) Filed: Nov. 28, 2007

(65) Prior Publication Data

US 2008/0084759 A1 Apr. 10, 2008

Related U.S. Application Data

(63) Continuation of application No. 11/441,250, filed on May 26, 2006, now Pat. No. 7,310,261.

(30) Foreign Application Priority Data

May 26, 2005 (TW) .............................. 94117304 A

(51) Int. Cl.
*G11C 11/34* (2006.01)

(52) U.S. Cl. ................. 365/185.22; 365/94; 365/102; 365/185.2; 365/185.28; 365/185.29

(58) Field of Classification Search ............... 365/94
See application file for complete search history.

(56) References Cited

U.S. PATENT DOCUMENTS 4,122,546 A * 10/1978 von Basse et al. ........... 365/190

\* cited by examiner

*Primary Examiner*—A. Zarabian
*Assistant Examiner*—Jason Lappas
(74) *Attorney, Agent, or Firm*—Birch, Stewart, Kolasch & Birch, LLP

(57) ABSTRACT

A nitride trapping memory device includes a comparator, a bias unit, a memory cell, a cycling cell, a compensation cell and a control unit. The comparator has a reference voltage. The bias unit is for outputting a bias voltage to the comparator, and the comparator outputs a bit value according to comparison of the bias voltage and the reference voltage. The memory cell is connected to the bias unit via a first switch. The cycling cell is connected to the bias unit via a second switch. The compensation cell is connected to the bias unit via a third switch. The control unit is for controlling the cycling cell and the compensation cell according to the bit value.

6 Claims, 3 Drawing Sheets

NITRIDE TRAPPING MEMORY DEVICE AND METHOD FOR READING THE SAME

This application is a Continuation of U.S. application Ser. No. 11/441,250, filed May 26, 2006 now U.S. Pat. No. 7,310,261 now in a state of allowability, which claims the benefit of Taiwanese Application 094117304 filed May 26, 2005.

BACKGROUND OF THE INVENTION

1. Field of the Invention

The invention relates in general to a nitride trapping memory device and method for reading the same, and more particularly to a method for dynamically adjusting read margin by using an extra cycling nitride trapping memory cell.

2. Description of the Related Art

Flash memory, a non-volatile semi-conductor memory element, is widely used many portable 3C products such as PDA, mobile phone, card reader, handy disc, and adaptor card due to the features of small volume, high capacity, low power consumption and re-writability.

Flash memory uses memory cell array to store logic data. Every memory cell includes a transistor having a gate electrode, a source electrode and a drain electrode. The gate electrode is coupled to a word line. A conventional memory cell uses the poly-silicon layer of the gate electrode to store the electrons. The poly-silicon layer is a conductive layer, which allows the electrons to move on poly-silicon layer freely. Therefore, every conventional memory cell can only store one bit of data. When reading the data stored in the conventional memory cell, the general practice is to apply a fixed read voltage onto the word line, so that the logic value stored therein is determined according to the current measured at the memory cell.

In order to achieve a high-density memory element, the Saifun Semiconductors Ltd. of Israel provides a nitride trapping memory cell. The nitride trapping memory cell is a memory allowing electrons to be erased or written into. The main difference between a nitride trapping memory cell and a conventional memory cell lies in that the nitride trapping memory cell uses a non-conductive nitride layer to store the electrons in the vicinity of the drain electrode and the source electrode. By doing so, every nitride trapping memory cell can store two bits of data, effectively increasing the density of the memory element.

However, if the area close to the drain electrode has already stored one bit of data, the second-bit effect will occur during the reverse read, causing the threshold voltage of forward read to rise up. Under such circumstance, the conventional method of applying a fixed read voltage to read the logic value stored in nitride trapping memory cell would reduce the reliability of the read data.

To resolve the above problem, the conventional method is to consider the second-bit effect in advance and pre-set a read '1' margin. That is, before the memory element leaves the factory, the increase in threshold voltage value due to the second-bit effect is already considered and the estimated increase in threshold voltage is pre-set at a read '1' margin, lest the reliability of the read data might be reduced due to the second-bit effect. However, such practice would increase the read voltage of the word line pre-set in the memory element, and increase read disturb effect in consequence.

Besides, a method of using two reference memory cells to read multi-bit flash memory and the device for making the same is disclosed. Each word line uses two reference memory cells respectively denoting that the word line has the distribution of the threshold voltages of high threshold voltage memory cells and the distribution of the threshold voltages of low threshold voltage memory cells. An average reference threshold voltage value can be obtained from the two reference memory cells. However, under practical operation, the threshold voltage of the two reference memory cells does not necessarily lie in the middle between the high threshold voltage distribution and the low threshold voltage distribution. Therefore, the read reference threshold voltage value obtained according to the above method is a read reference threshold voltage value obtained under ideal circumstances.

Moreover, U.S. Pat. No. 6,639,849 discloses a method which controls the threshold voltage value of the second reference memory cell according to the initial threshold voltage value of the first reference memory cell, so that the read reference threshold voltage value obtained from the first reference memory cell and the second reference memory cell can be assured to lie between the high threshold voltage distribution and the low threshold voltage distribution. However, complicated erasing routines and program verification routines are applied in the reference memory cell, not only increasing the difficulty in the design of circuits, but also increasing the read time.

SUMMARY OF THE INVENTION

It is therefore the object of the invention to provide a nitride trapping memory device and method for reading the same. According to threshold voltage variation of an extra cycling cell, enough read margin can be kept without second bit effect and cycling effect.

The invention achieves the above-identified object by providing a nitride trapping memory device including a comparator, a bias unit, a memory cell, a cycling cell, a compensation cell and a control unit. The comparator has a reference voltage. The bias unit is for outputting a bias voltage to the comparator, and the comparator outputs a bit value according to comparison of the bias voltage and the reference voltage. The memory cell is connected to the bias unit via a first switch. The cycling cell is connected to the bias unit via a second switch. The compensation cell is connected to the bias unit via a third switch. The control unit is for controlling the cycling cell and the compensation cell according to the bit value. In a first stage, the first switch and the third switch turn off, and the second switch turns on, the control unit measures a threshold voltage Vt1 of the erased cycling cell according to the bit value, and programs a neighbor bit of the cycling cell. In a second stage, the first switch turns off and the second switch and the third switch turn on, the control unit verifies the cycling cell by the voltage Vt1 and programs the compensation cell with a verify voltage Vt1 until the bias voltage is substantially equal to the reference voltage. In a third stage, the second switch turns off, and the first switch and the third switch turn on, a read operation is performed on the memory cell and the compensation cell.

The invention achieves the above-identified object by providing a method for reading a nitride trapping memory device. The nitride trapping memory device includes a bias unit, a memory cell, a cycling cell and a compensation cell. The memory cell, the cycling cell and the compensation cell are connected to the bias unit and the bias unit is for outputting a bias voltage. The method includes erasing the memory cell, the cycling cell and the compensation cell; measuring a threshold voltage Vt1 of the erased cycling cell; programming a neighbor bit of the cycling cell; verifying the cycling cell by the voltage Vt1 with the memory cell turned off and programming the compensation cell with a verify voltage Vt1 until the bias voltage is substantially equal to a reference voltage; and reading the memory cell as well as the compensation cell with the cycling cell turned off.

The invention achieves the above-identified object by providing a method for reading a nitride trapping memory device. The nitride trapping memory device includes a memory sector and a cycling cell. The method includes erasing the memory sector as well as the cycling cell; measuring a first threshold voltage Vt1 of the erased cycling cell; programming a neighbor bit of the cycling cell; measuring a second threshold voltage Vt2 of the programmed cycling cell; and deciding an erase verify (EV) value and a program verify (PV) value for a next program or erase operation according to difference (Vt1-Vt2) of the first threshold voltage Vt1 and the second threshold voltage Vt2.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
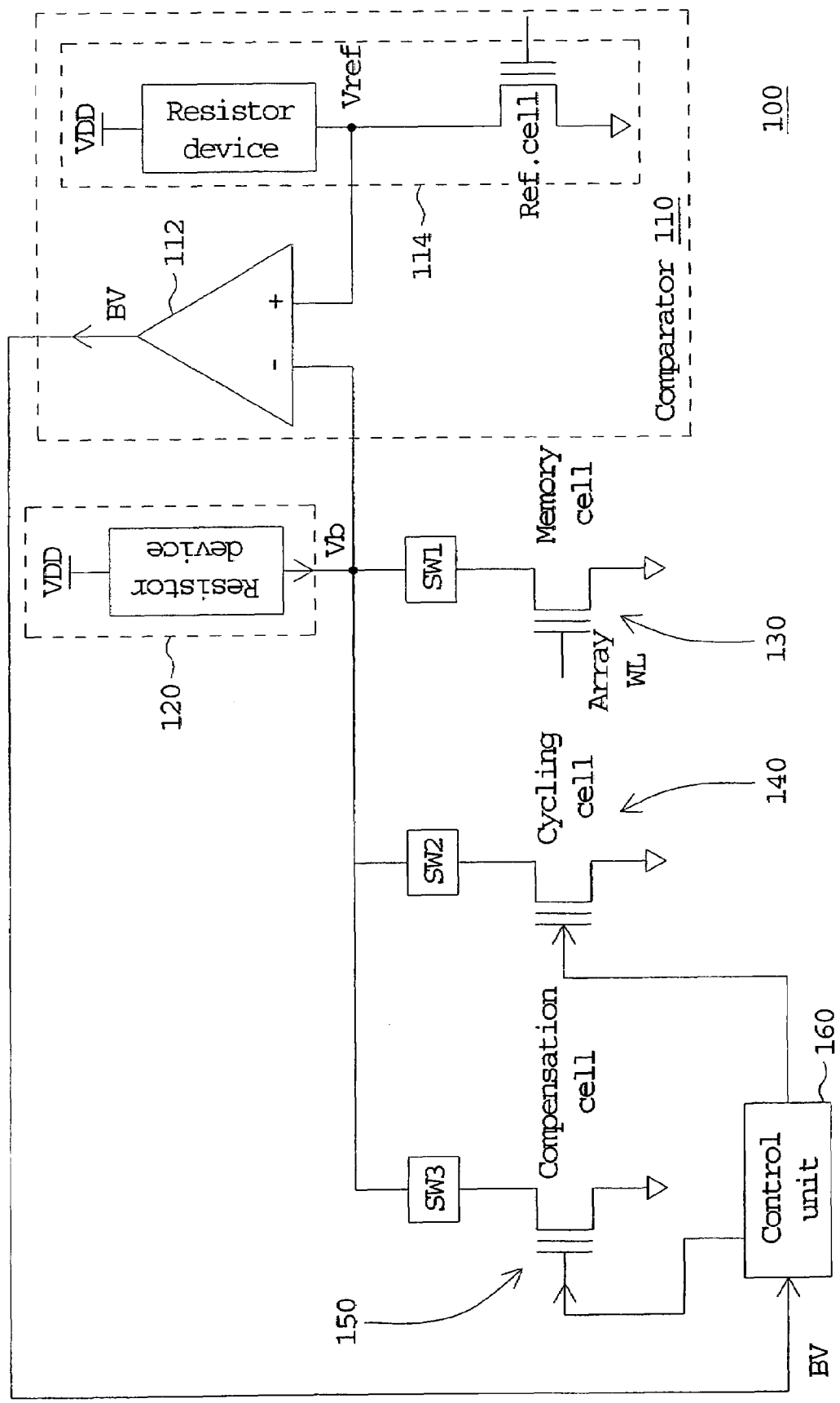
FIG. 1 is a block diagram of a nitride trapping memory device according to a preferred embodiment of the invention.

Referring to FIG. 1, a block diagram of a nitride trapping memory device according to a preferred embodiment of the invention is shown. The nitride trapping memory device 100 includes a comparator 110, a bias unit 120, a memory cell 130, a cycling cell 140, a compensation cell 150 and a control unit 160. The comparator 110 includes a differential amplifier 112 and a reference cell unit 114. The reference cell unit 114 provides a reference voltage Vref, and the differential amplifier 112 has a positive end (+) connected to the reference voltage Vref and a negative end (−) connected to a bias voltage Vb of the bias unit 120. The bias unit 120 includes a resistor device connected to an operational voltage VDD for outputting the bias voltage Vb to the comparator 110. The comparator 110 outputs a bit value BV according to comparison of the bias voltage Vb and the reference voltage Vref. That is, if the bias voltage Vb is larger than the reference voltage Vref, the BV is '0', and if the bias voltage Vb is smaller than the reference voltage Vref, the BV is '1'.

The memory cell 130 is connected to the bias unit 120 via a first switch SW1. The cycling cell 140 is connected to the bias unit 120 via a second switch SW2. The compensation cell 150 is connected to the bias unit 120 via a third switch SW3. The cycling cell 140 and the compensation cell 150 are nitride trapping memory cells as the memory cell 130. The first switch SW1, the second switch SW2 and the third switch SW3 are metal-oxide-semiconductor (MOS) transistors for instance. The control unit 160 is for controlling (the gate voltage of) the cycling cell 140 and the compensation cell 150 according to the bit value BV. One memory cell 130 configured with the cycling cell 140 and compensation cell 150 is taken for example in the embodiment, however, in the memory device 100, there are usually a number of memory sectors and each memory sector has many rows of memory cells 130, each of which is connected to a word line (WL). For a word line, only a bit number, such as 16, of memory cells 130 are read at a time. Therefore, in the embodiment, a number of memory cells 130 connected to the same bit line (BL) can be also connected to the same comparator 110, cycling cell 140 and compensation cell 150.

In a first stage, the first switch SW1 and the third switch SW3 turn off, and the second switch SW2 turns on, the control unit 160 measures a threshold voltage Vt1 of the erased cycling cell 140 according to the bit value BV, and programs a neighbor bit of the cycling cell 140. In a second stage, the first switch SW1 turns off and the second switch SW2 and the third switch SW3 turn on, the control unit 160 verifies the cycling cell 140 by the voltage Vt1 and programs the compensation cell 150 with a verify voltage Vt1 until the bias voltage Vb is substantially equal to the reference voltage Vref. In a third stage, the second switch SW2 turns off, and the first switch SW1 and the third switch SW3 turn on, a read operation is performed on the memory cell 130 and the compensation cell 150. Therefore, the read margin of low Vt region can be dynamically adjusted and enough read margin can be kept without the second bit effect.

Figure 2:
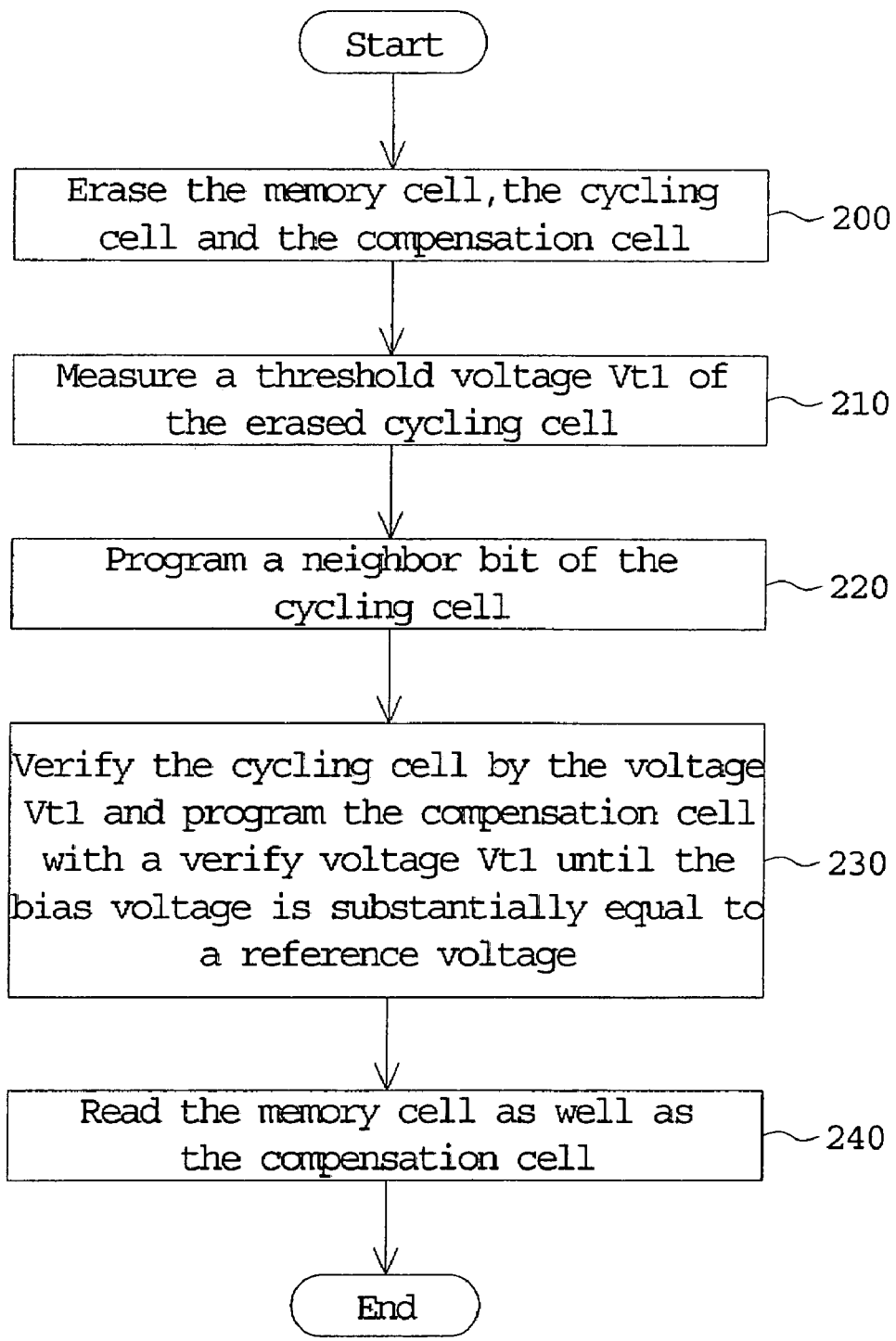
FIG. 2 is a flowchart of a method for reading a nitride trapping memory device according to a preferred embodiment of the invention.

Referring to FIG. 2, a flowchart of a method for reading the nitride trapping memory device 100 according to the preferred embodiment of the invention is shown. First, in step 200, erase the memory cell 130, the cycling cell 140 and the compensation cell 150 to all '1'. As described above, a memory sector including a number of memory cells 130 can be erased synchronously with the associated cycling cell 140 and compensation cell 150. Following that, in step 210, measure a threshold voltage Vt1 of the erased cycling cell 140. For example, a voltage, increasing from an initial value, is provided to a word line of the cycling cell 140 with the first switch SW1 and the third switch SW3 turned off and the voltage applied to the word line of the cycling cell 140 is determined to be the threshold voltage Vt1 as the bias voltage Vb is substantially equal to the reference voltage Vref. That is, when the voltage of the initial value is applied to the word line of the cycling cell 140, the bias voltage Vb is larger than the reference voltage Vref and the bit value BV is '0'. When the voltage applied to the word line of the cycling cell 140 is increased to the threshold voltage Vt1, the bias voltage Vb is lowered to slightly below the reference voltage Vref and the bit value BV is changed to '1'.

Next, in step 220, program a neighbor bit of the cycling cell 140 to '0'. For example, before programming, the two bits of the cycling cell 140 are erased to a low Vt state with the Vt1 about 2.5V. After one bit of the cycling cell 140 is programmed to '0', the bit is programmed to a high Vt state with a Vt up to about 5V. However, the other bit is affected by the second bit effect to have a Vt about 2.8V. Then, in step 230, verify the cycling cell 140 by the voltage Vt1 with the first switch SW1 turned off and program the compensation cell 150 with a verify voltage Vt1 until the bias voltage Vb is substantially equal to a reference voltage Vref. For example, before the programming, a cycling cell current Icc flowing by the cycling cell 140 with verify voltage 2.5V is about 8 mA, a compensation cell current Icomp flowing by the compensation cell 150 is about 8 mA with verify voltage 2.5V, and consequently, the bias voltage Vb is smaller than the reference voltage Vref and the bit value BV is '1'. The compensation cell 150 is programmed until the compensation cell current Icomp is lowered to a value, such as 2 mA, such that the bias voltage Vb is slightly above the reference voltage Vref, that is, the bit value BV is changed to '0'. At the time, the cell current (8+2=10 mA) of verify consists of the cycling cell current Icc (8 mA), and the compensation cell current Icomp (2 mA).

Finally, in step 240, read the memory cell 130 as well as the compensation cell 150 with the second switch SW2 turned off. The read current is composed of a memory cell current Ic flowing by the memory cell 130 and the compensation current Icomp flowing by the compensation cell 150. Although the threshold voltage of the memory cell 130 may be increased due to the second effect, which reduces the cell current Ic of the memory cell 130. However, due to compensation of the compensation cell current Icomp, the bias voltage Vb determined by the memory cell 130 and the compensation cell 150 in the read operation is just like that bias voltage Vb determined by the memory cell 130 without the second bit effect. Therefore, enough read margin can still be kept for low bit region and the second bit effect post cycling stress can be eliminated.

Figure 3:
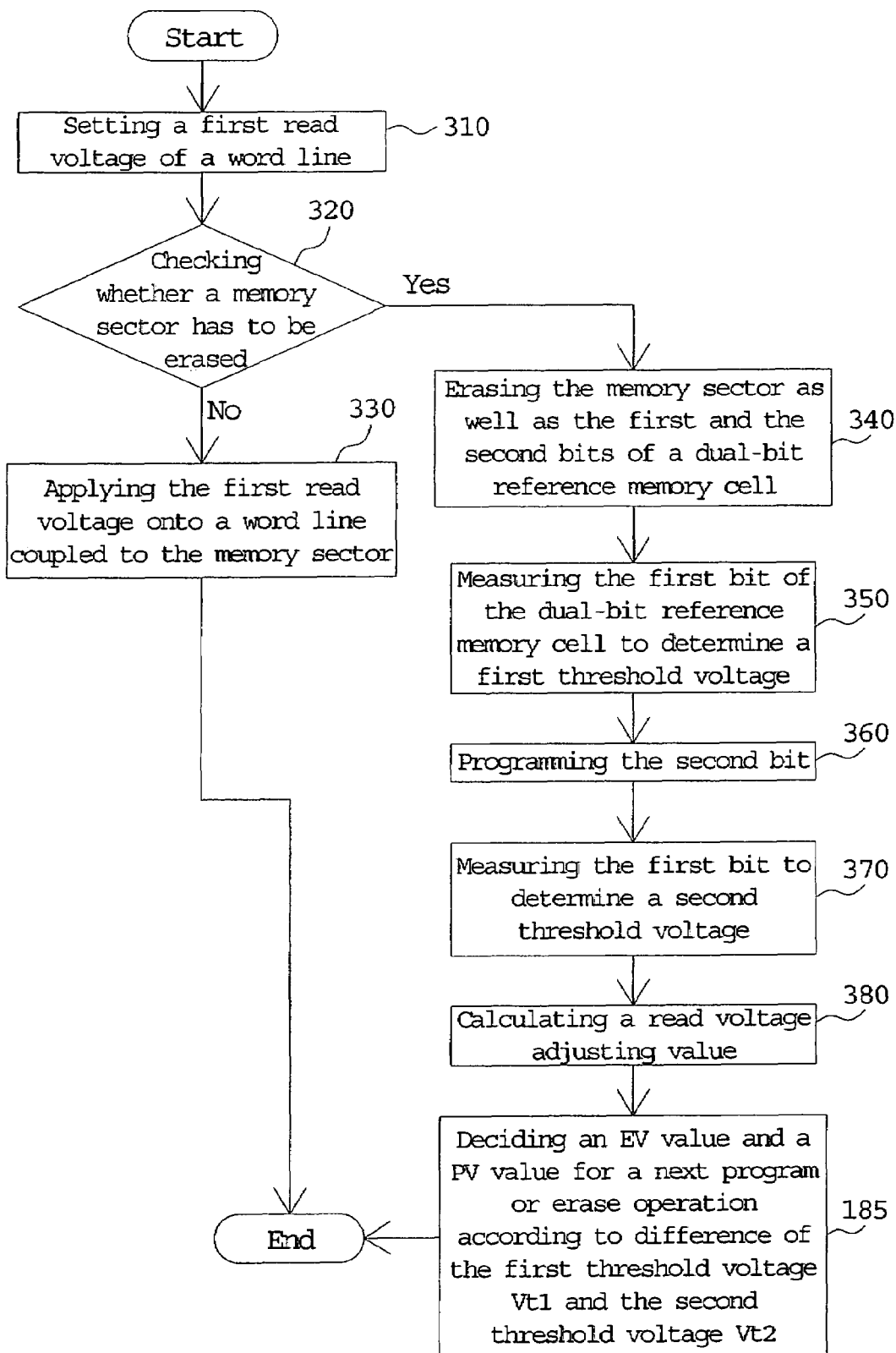
FIG. 3 is a flowchart of another method for reading a nitride trapping memory device.

Although, the method for reading a nitride trapping memory device is illustrated by the steps shown in FIG. 2, the invention can also use another method to read the nitride trapping memory device 100 as shown in FIG. 3. At first, in step 310, a first read voltage V1 of a word line of a memory sector is set. Generally speaking, the first read voltage V1, which is pre-set before the memory device leaves the factory, is applied to the word line of the nitride trapping memory cells 130 when reading the nitride trapping memory device 100. Next, proceed to step 320, whether the memory sector has to be erased is checked. The memory sector includes several nitride trapping memory cells 130. For example, a 64M bits memory device 100 can have 64 memory sectors. That is, every memory sector is used to store 1 M bits of logic data.

If the memory sector does not have to be erased, then proceed to step 330, the first read voltage V1 is applied to the word line of the memory sector to read the logic value of a bit of a nitride trapping memory cell 130 of the memory sector. The method is terminated.

If the memory sector has to be erased, then proceed to step 340, the memory sector as well as the first and the second bits of the cycling cell 140 are erased. Proceed to step 350, the first bit of the cycling cell 140 is measured to determine a first threshold voltage Vt1. The cycling cell 140 possesses similar physical characteristics with the nitride trapping memory cell 130 of the memory sector. Next, proceed to step 360, the second bit of the cycling cell 140 is programmed for the second bit to be changed to the logic 0 state. Meanwhile, the first bit is still at the logic 1 state. Next, proceed to step 370, the first bit of the cycling cell 140 is measured to determine a second threshold voltage Vt2. Due to the second-bit effect, the second threshold voltage Vt2 measured in step 370 is larger than the first threshold voltage Vt1. Finally, in step 380, an erase verify (EV) value and a program verify (PV) value for a next program or erase operation are decided according to a difference value (Vt1-Vt2) of the first threshold voltage Vt1 and the second threshold voltage Vt2. The EV value may be lowered down or the PV value is lifted up in accordance with the difference value (Vt1-Vt2). Therefore, the read margin can be dynamically adjusted according to the difference value of the first threshold voltage Vt1 and the second threshold voltage Vt2 of the cycling cell 140, and second bit effect post cycling stress can be thus eliminated.

It can be understood from the above embodiment that the dual-bit cycling cell, possessing similar physical characteristics with the nitride trapping memory cell of the memory sector, can truthfully reflect the influence imposed on the nitride trapping memory cell of a memory sector by the second-bit effect. Therefore, in the course of reading data, the read margin can be dynamically adjusted according to the above method, so that the second-bit effect can be eliminated and that the lifespan of the memory element can be prolonged. Besides, when the above method is used to adjust a read voltage of a word line, the read '1' margin no longer has to take the second-bit effect into consideration. Therefore, a read voltage of a word line can be effectively reduced, and the object of reducing the read disturb effect is achieved in consequence.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for reading a nitride read only memory device comprising a memory cell, a cycling cell and a compensation cell connected to a bias unit, the bias unit outputting a bias voltage, the method comprising:

erasing the memory cell, the cycling cell and the compensation cell so to obtain a threshold voltage Vt1 of the erased cycling cell;

programming a neighbor bit of the cycling cell;

verifying the cycling cell by the voltage Vt1 with the memory cell turned off and programming the compensation cell with a verify voltage Vt1 until the bias voltage is substantially equal to a reference voltage; and reading the memory cell as well as the compensation cell with the cycling cell turned off.

2. The method according to claim 1, wherein the step of obtaining the threshold voltage Vt1 of the erased cycling cell comprises providing a voltage, increasing from an initial value, to a word line of the cycling cell with the memory cell and compensation cell turned off and determining the voltage applied to the word line of the cycling cell to be the threshold voltage Vt1 as the bias voltage is substantially equal to the reference voltage.

3. The method according to claim 1, wherein in the step of verifying the cycling cell by the voltage Vt1, a cell current of verify consists of a cycling cell current flowing by the cycling cell and a compensation cell current flowing by the compensation cell.

4. The method according to claim 1, wherein in the step of reading the memory cell as well as the compensation cell, a read current is composed of a memory cell current flowing by the memory cell and a compensation current flowing by the compensation cell.

5. The method according to claim 1, further comprising measuring a second threshold voltage Vt2 of the programmed cycling cell; and deciding an erase verify (EV) and a program verify (PV) value for a next program or erase operation according to difference (Vt1-Vt2) of the first threshold voltage Vt1 and the second threshold voltage Vt2.

6. The method according to claim 5, further comprising setting a first read voltage of a word line of a memory sector;

checking whether the memory sector has to be erased;

applying the first read voltage to the word line of the memory sector to read a memory cell of the memory sector if the memory sector does not have to be erased; and executing a step of erasing the memory sector as well as the cycling cell if the memory sector has to be erased.

* * * * *